United States Patent [19]
Bailey et al.

[11] Patent Number: 5,498,313
[45] Date of Patent: Mar. 12, 1996

[54] SYMMETRICAL ETCHING RING WITH GAS CONTROL

[75] Inventors: Michael E. Bailey, Northfield; Dinh Dang, Essex Junction; James G. Michael, Burlington; Timothy E. Neary; Paul W. Pastel, both of Essex Junction; Sylvia R. R. Tousley, South Burlington; Arthur C. Winslow, Essex Junction, all of Vt.

[73] Assignee: International Business Machines Corp., Armonk, N.Y.

[21] Appl. No.: 147,653

[22] Filed: Nov. 3, 1993

Related U.S. Application Data

[63] Continuation-in-part of Ser. No. 109,793, Aug. 20, 1993.

[51] Int. Cl.⁶ .................................................. H01L 21/00
[52] U.S. Cl. .................... 156/643.1; 156/345; 118/723 E
[58] Field of Search .................... 156/643.1, 345; 427/535; 118/728, 732, 723 E, 723 R

[56] References Cited

U.S. PATENT DOCUMENTS

| | | | |
|---|---|---|---|
| 4,380,489 | 4/1983 | Beinvogl et al. | 156/345 |
| 4,512,841 | 4/1985 | Cunningham, Jr. et al. | 156/345 |
| 4,632,719 | 12/1986 | Chow et al. | 156/345 |
| 4,793,975 | 12/1988 | Drage | 422/186.05 |

FOREIGN PATENT DOCUMENTS

| | | | |
|---|---|---|---|
| 61-039520 | 2/1986 | Japan . | |
| 62-030327 | 2/1987 | Japan . | |
| 63-16625 | 1/1988 | Japan | H01L 21/302 |
| 63-48827 | 3/1988 | Japan | H01L 21/302 |
| 1-140725 | 6/1989 | Japan | H01L 21/302 |
| 03055831 | 3/1991 | Japan . | |
| 2175542 | 4/1986 | United Kingdom | C23F 1/02 |

OTHER PUBLICATIONS

H. Leung, "Introducing the Precision Etch 8310 Molecular Backside Cooling (MBC) Capability," Applied Material, Inc., Spring 1990.

*Primary Examiner*—R. Bruce Breneman
*Assistant Examiner*—George Goudreau
*Attorney, Agent, or Firm*—Thornton & Thornton; Lawrence H. Meier

[57] ABSTRACT

In a plasma or RIE etching tool using a uniquely designed annulus around a wafer supporting pedestal, it has been found that the introduction of one or more gases in the region immediately adjacent the annulus controls the amount of etching of features in that region in the surface of the wafer mounted on the pedestal. By so controlling the amount of gas in this region, the slope of the walls of the etched features can be also controlled.

3 Claims, 8 Drawing Sheets

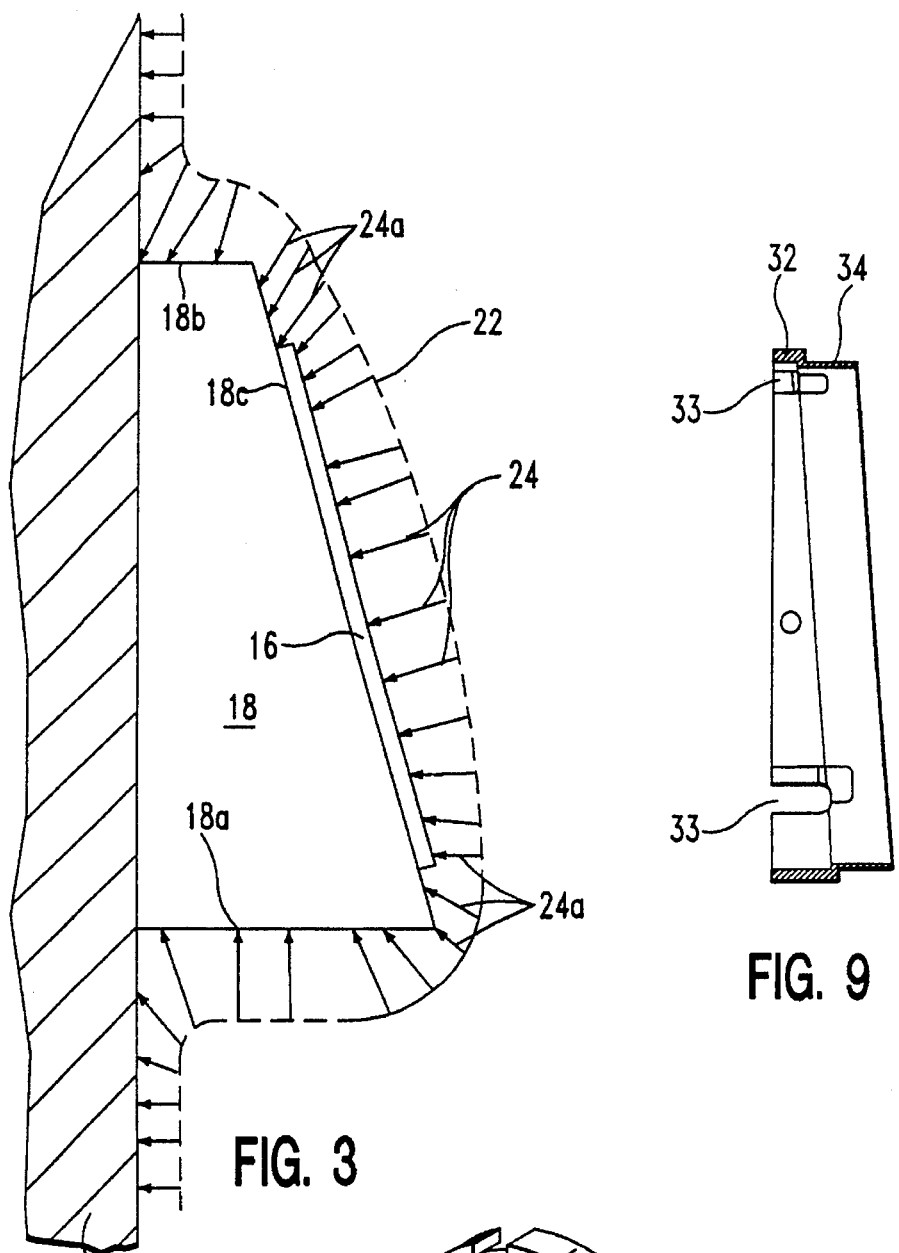
FIG. 3
FIG. 9
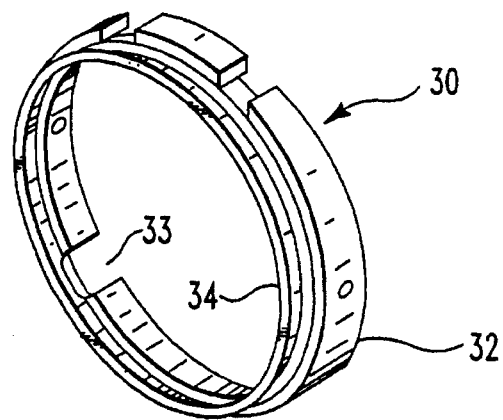
FIG. 8

SYMMETRICAL ETCHING RING WITH GAS CONTROL

RELATED APPLICATIONS

This is a continuation in part of an application entitled "Symmetrical Etching Ring" Ser. No. 08/109,793 filed Aug. 20, 1993.

FIELD OF THE INVENTION

This invention relates to plasma etching or Reactive Ion Etching (RIE) of semiconductor wafers. More particularly it relates to an improved plasma or RIE etching apparatus electrode structure and process for etching holes in semiconductor wafer surfaces.

BACKGROUND OF THE INVENTION

RIE and plasma etching techniques have been widely used for etching products such as semiconductor wafers. Basically such a technique comprises exposing the wafers to the plasma to remove, in selected regions, selected surface materials, such as silicon dioxide, carried on the semiconductor wafer surface. Polymeric materials, such as photoresist, are used as etch masks to prevent unwanted etching. Because the etch process determines if etching is done in a chemical or physical mode, etching of the selected materials can be very closely controlled.

Although the etching tools presently used are greatly improved over those in the past, and the gas flow, pressure, and temperature as well as the gross electric fields, and plasma formation is more closely controlled than was possible in the past, asymmetrical etching may still occur during the process.

RIE or plasma etching occurs because the ions doing the etching are extracted from the plasma by the electric field existing between the wafer, the pedestal and the plasma sheath, i.e., the edges of the plasma cloud. The ions extracted from the plasma follow the electric field lines to impact on and react with the selected exposed regions on the face of the wafer. Ideally these electric field lines should be normal to the surface of the wafer over its entire face. However, in apparatus used in the industry the edges of the wafer and pedestal, and the wafer hold down clips, used in some apparatus, each induce distortion or variations in the direction of the electrical field lines between the plasma sheath, the wafer, the pedestal and the clips. The angling of the wafer pedestals exacerbates electric field and plasma sheath distortion. Thus, the pedestal design can increase the non-normality of the electric fields at and near the edges of the wafer. Such electrical field variation causes the ions, drawn out of the plasma and effecting the etching, to interact with the wafer surface at acute or obtuse angles to the surface of the wafer. Any non-normal angle of incidence of the ions causes asymmetrical etching to occur in the wafer. Such asymmetrical etching is especially acute around the periphery of the wafer because of the high plasma sheath and electrical field line distortion caused by the wafer and pedestal edges.

Many attempts to address problems of non-uniformity have been tried in the past. These attempts include spacing the wafers from the cathode with quartz spacers, curving the surface of the wafer, altering the plasma gas flow, and when large area flat anodes were used, providing tailored wafer pedestals that were varied in direction with respect to the geographical position of the wafer on the cathode. Also the apparatus was itself altered by discarding the large flat plate of the prior art, and substituting therefor a centrally located hexagonal post upon which the wafers were affixed in a substantially vertical direction.

The solutions discussed above did result in improvements to the overall etching uniformity. However, symmetry of etching over the entire surface of the wafer was not realized.

As the demand for increasingly dense semiconductor devices has increased, even the slightest variation in the symmetry of the etched holes in the surface becomes problematic resulting in even more defective devices. Although the addition of the annulus, as taught in the above identified related application, greatly improves the symmetry of the etched holes it has now been found that the presence of the annulus appears to alter the amount, mixture, or distribution of the etching gas or gases in a region immediately adjacent the annulus. This region will herein after be referred to as the "gas depletion region". In this gas depletion region, there is decreased removal of the material being etched, thus causing the slope of the side walls of the etched holes, around the periphery of the wafer, to be considerably steeper than the walls of the etched holes in the center of the wafer.

SUMMARY OF THE INVENTION

The present inventors have now found, in a batch etching tool, that by providing each wafer supporting pedestal having a surrounding annulus, i.e., a ring or collar, with an additional gas flow at the periphery of the wafer, adjacent the annulus, the slope of the walls of etched openings at the periphery of the wafer can be made to match the slope of the walls of the etched openings in the center of the wafer. Thus, more uniform and symmetrically etched openings can be achieved across the entire face of each wafer in the etching tool.

This significant improvement is achieved by providing a support pedestal for each wafer, encircling each pedestal with an insulating annulus and providing means for forcing one or more process gases into the gas depletion region thus preventing any variation in the slope of the walls being etched regardless of their position on the wafer surface.

Accordingly, it is an object of the present invention to improve etching uniformity and symmetry of wafers being etched in a plasma etching apparatus by assuring (1) that the electric field lines between the plasma sheath and the wafer are substantially normal to the entire wafer surface resulting in etching that is symmetric across the entire face of the wafer and (2) that the gas needed for the etching is not depleted in the region immediately adjacent the annulus.

It is another object of the invention to provide an arrangement that controls or balances the process gas distribution across the entire surface of the wafer and assures that the etching of all features, in all areas of the wafer surface, are etched symmetrically and uniformly.

These and other objects and features of the invention will become further apparent from the following description taken in conjunction with the drawings.

BRIEF DESCRIPTION OF THE DRAWINGS

FIG. 3 is a cross sectional view of one of the wafer support pedestals used in the apparatus of FIG. 1 showing the plasma sheath surrounding the pedestal and the electric field lines extending between the sheath and the wafer as they exist in the prior art.

FIG. 8 is an isometric view of the annulus.

FIG. 9 shows a cross-sectional view of the annulus showing how it is tapered to conform to the pedestal of the apparatus used.

DESCRIPTION OF THE PREFERRED EMBODIMENT

By providing each pedestal upon which a wafer sits with an annulus, i.e. a ring or collar, the electric field distortions found in apparatus not using the annulus are substantially eliminated. The annulus substantially eliminates such distortions by creating a substantially uniform plasma sheath across the entire surface of the wafer being etched, thereby resulting in the ultimate in preferred directionality of the ions extracted from the plasma and impacting on the wafer surface, and providing the finest etching symmetry possible. Unfortunately, under certain circumstances the annulus may also causes the process gases to become altered or depleted in the region immediately adjacent the annulus. This alteration or depletion of the gases adjacent the annulus causes, around the periphery of the wafer, the rate of etching of the features in the surface to also become altered. This change in etching rate results in an increase in the slope of the walls of the etched features around the periphery of the wafer relative to those etched in the center of the wafer.

Figure 1:
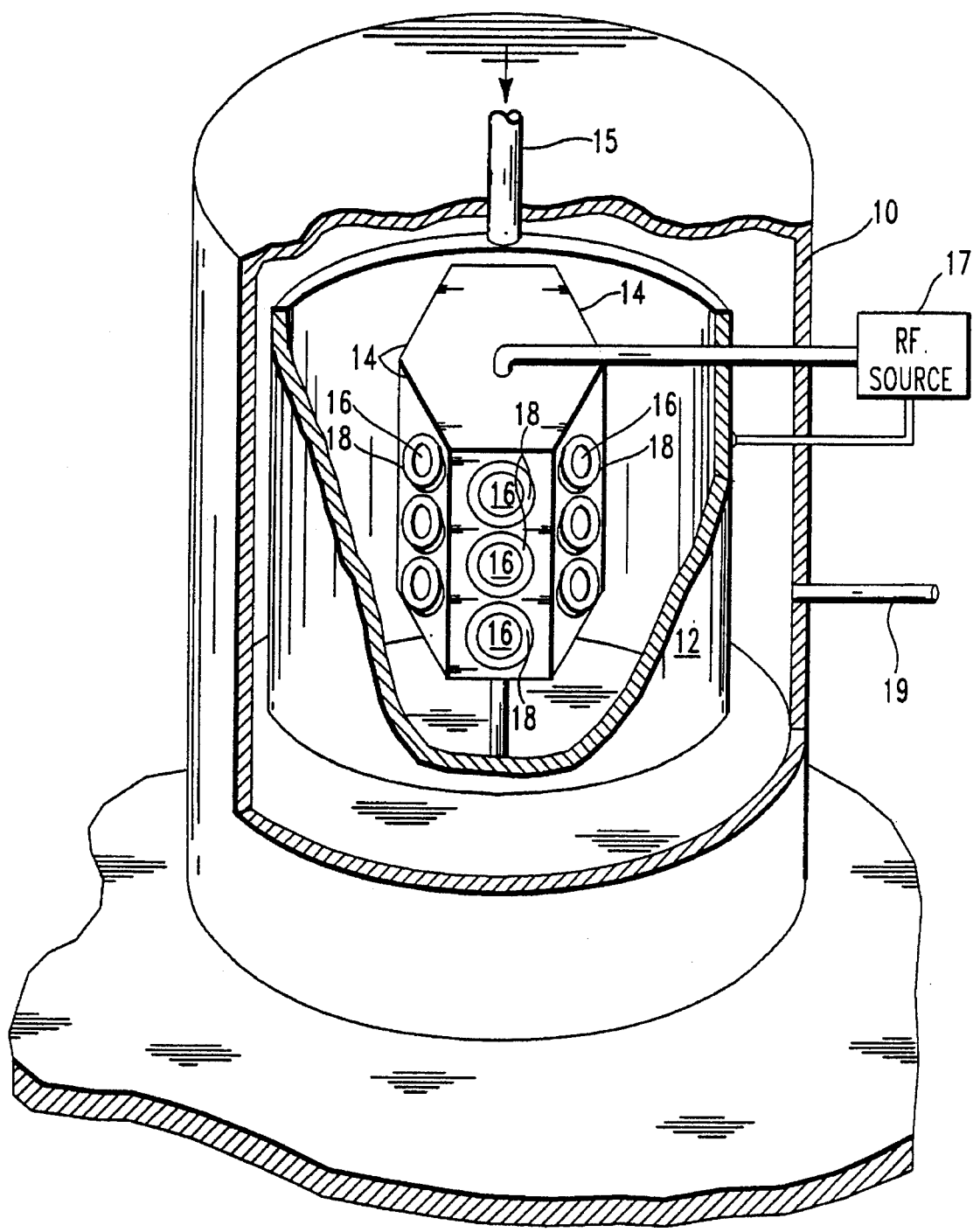
FIG. 1 is an overall schematic view of a batch etching apparatus.

Today, wafer products are commonly etched in batches. FIG. 1 shows a cut away, schematic view of a batch type plasma etcher commonly used in the semiconductor industry. Such an apparatus is sold by the Applied Materials Corp. under the designation of Model 8310. This apparatus is a low pressure, batch wafer, reactive ion etch tool. As shown, this apparatus comprises a pressure chamber 10, usually made of stainless steel or other suitable metal, in which is positioned a circumferential anode electrode 12 and a central hexagonal cathode 14 which is carrying, on each face, a plurality of vertically aligned, tapered pedestals 18. Wafers 16, to be etched, are mounted on the tapered pedestals 18. Both the anode and cathode are coupled to a suitable radio frequency (RF) source 17. A suitable process gas is introduced into the chamber 10 via tube 15 from a suitable source (not shown). With such a gas at the appropriate pressure in the chamber a plasma is formed when the RF source 17 is turned on. When desired or required the gas is extracted from the chamber 10 via an outlet tube 19 coupled to a vacuum pump (not shown). Since, as indicated above, such apparatus is widely used in the semiconductor industry and is commercially available, it need not be further discussed or described as to its general features or to its methods of use.

Figure 2:
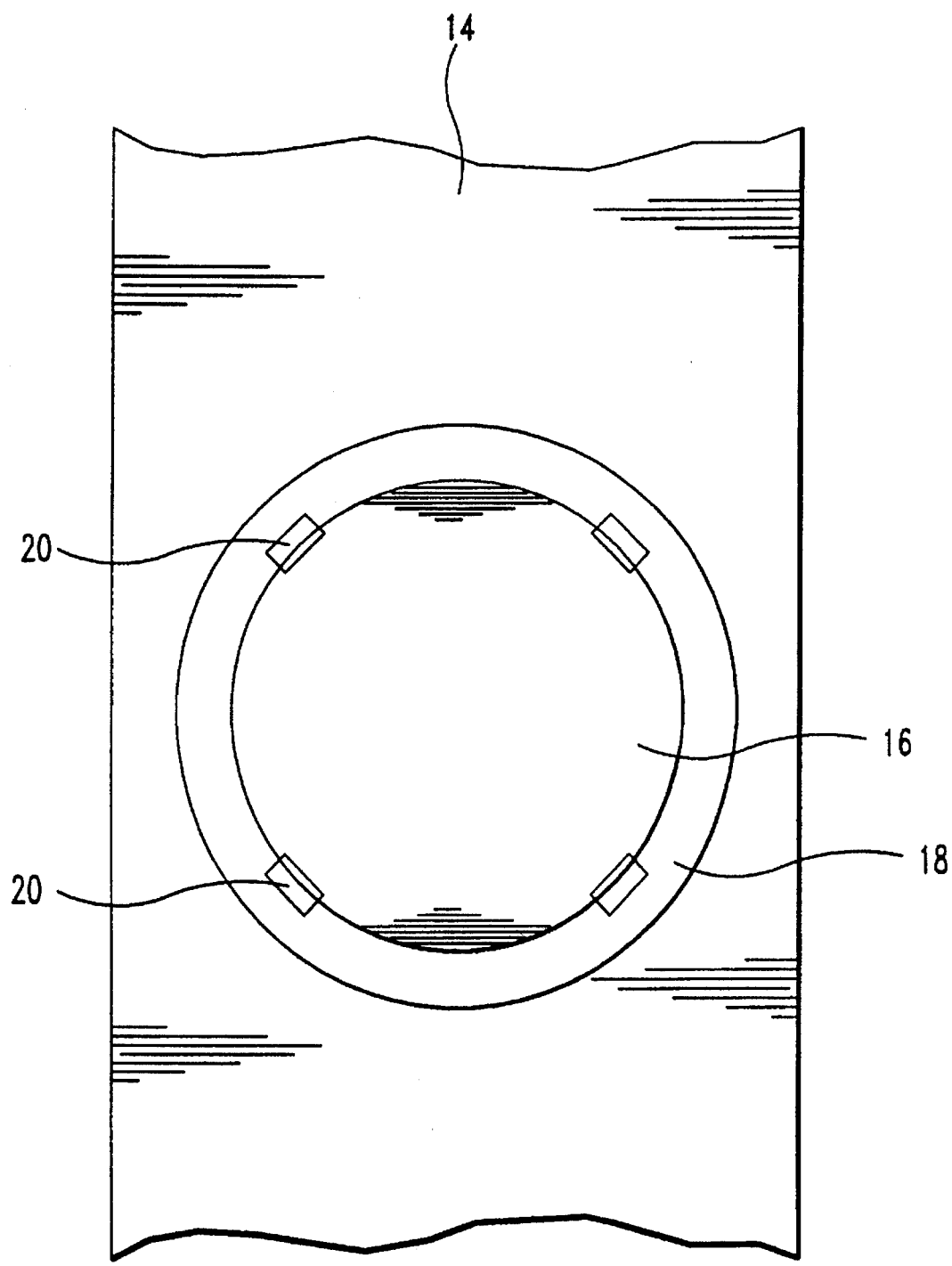
FIG. 2 is a top view of one of the wafer support pedestals used in the apparatus of FIG. 1 showing a wafer held thereon by clips.

FIGS. 2, and 3 show in greater detail a pedestal 18, and a wafer 16 mounted thereon. FIG. 2 is a top view of the pedestal 18 having the wafer 16 secured thereto. In the actual Applied Materials apparatus the wafer is secured by a plurality of S-shaped holding clips 20. Other plasma etching apparatus can use different hold down methods. FIG. 3 shows a side view of the pedestal 18, the wafer 16, the plasma sheath 22 and the electric field lines 24 existing between the sheath and the pedestal and the wafer as would be found in the described Applied Materials etching tools. It is clear from this FIG. 3 that the pedestal 18 is thicker at its bottom 18a than at its top 18b so that the face of the pedestal is at an angle with respect to the central cathode 14. This sloped face 18c of the pedestal 18 is required by the handling methods presently used to place and remove the wafers on and off the pedestal. The angle of slope on the pedestal face 18c with respect to the perpendicular face of the cathode 14 further exacerbates the distortion of the plasma sheath and the bending of the electric fields. The effect occurs around the entire pedestal perimeter and can vary with pedestal material. The field lines can also be slightly distorted in the vicinity of the clips 20 if they are used to hold the wafer on the pedestal. However, such distortion in the vicinity of the clips is so minimal it does not apparently affect the symmetry of adjacent feature etched in the wafer surface.

As shown in FIG. 3 the edge of the pedestal causes distortion of the plasma sheath in the vicinity of the wafer and pedestal edge with consequent bending and non-normal directionaly of the field lines 24 relative to the surface of wafer 16. The effects of this distortion extend out as far as 25 mm from the wafer edge. As shown in this drawing the field lines 24 become more and more non-normal in direction as the edge of the wafer and the edge of the pedestal is approached. These non-normal field lines are numbered 24a. Because, as noted above, the ions extracted from the plasma follow the field lines any field lines that are not normal to the wafer surface cause asymmetry in the etched features, e.g., holes or openings, in the surface of the wafer. On a 125 mm diameter wafer this can impact on forty percent (40%) of the chips produced in the wafer.

Figure 4:
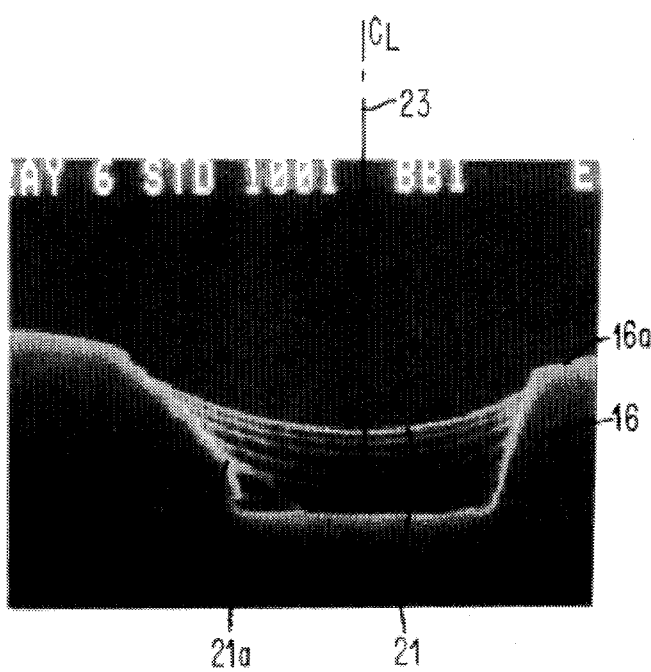
FIG. 4 is a cross sectional view of a feature, i.e. a hole, etched in the surface of a wafer when the wafer was positioned on the pedestal shown in FIGS. 2 and 3.
Figure 5:
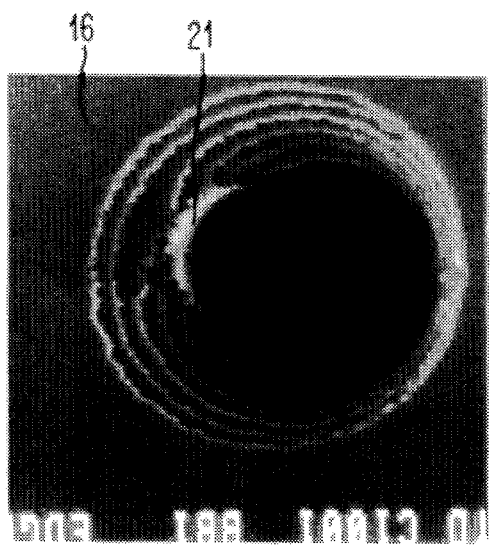
FIG. 5 is a top view of the etched hole of FIG. 4.

This asymmetry is particularly apparent from even the most cursory review of FIGS. 4 and 5 which are actual scanning electron microscope (SEM) photographs of an opening 21, i.e. a hole, etched in the surface of a semiconductor wafer using the prior art apparatus. FIG. 4 is a sectional view of the hole 21 and FIG. 5 is a top view of the same hole 21. This hole 21 was produced in the surface of a semiconductor wafer 16 by a series of paired photoresist and oxide etch steps. The effect of the asymmetry around an axis 23 (FIG. 4) extending perpendicularly from the center of the bottom of the hole 21 is apparent on the left side 21a of the hole 21 especially in FIG. 5 after the second etch step. It is clear from this Fig. that the left wall of the hole is at a greater angle with respect to a line drawn perpendicular to the wafer surface than is the right hand wall thus rendering the hole asymmetrical. This asymmetry becomes more exaggerated as the number of etch steps increase.

Figure 6:
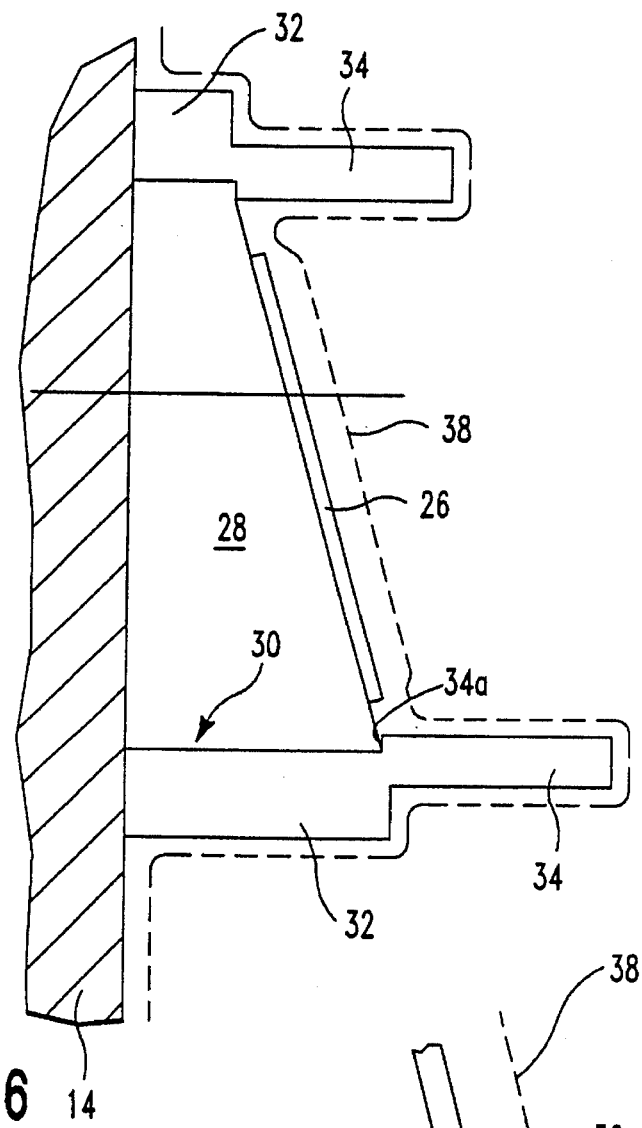
FIG. 6 is a cross sectional view of a wafer support pedestal used in the apparatus of FIG. 1 but modified by the addition of an annulus.

FIG. 6 shows a side view of a pedestal 28 having a wafer 26 mounted thereon. This pedestal 28 is provided with the unique annulus 30. This annulus 30, shown in greater detail in FIG. 8 is formed of an insulative or dielectric material such as ceramic or plastic.

This annulus 30 has a thicker lower rim 32 and a thinner, upper, and extended circumferential wall 34. The lower rim 32 is tapered across its diameter as shown in FIG. 9 to match the taper of the pedestal around which it is positioned as illustrated in FIG. 6. When holddown clips are used the annulus 30 is further provided with a plurality of passageways 33 spaced around the circumference of the rim so as to be adjacent the clips 20.

When designing the annulus the wall height is selected to cause the plasma sheath to be uniform across the entire surface of the wafer. If the wall height is excessive, say about 6 cm the plasma sheath is again distorted and the effect of the annulus is lost. The wall thickness should be as thin as possible while remaining consistent with the characteristics of the material used. Thus for some molded materials, e.g., ceramics, the character of the material may require a thicker wall than required for a machined plastic. Finally the wall's inner diameter preferably should be no more than 20 mm from the wafer's edge and no closer than 5 mm to the edge of the wafer.

The actual annulus used to achieve the results set forth in this preferred embodiment was formed from a polycarbonate plastic, sold under the tradename LEXAN by the General Electric Company. This annulus 30, used with the Applied Materials Corp. Model 8310, has a rim 32 whose inner diameter is 14.70 cm and an upper extended wall 34 which has an inner diameter of 14.45 cm, a height of 1.78 cm above the pedestal surface 18b and a thickness of 0.508 cm. It should be noted that the inner diameter of wall 34 is smaller than that of the lower rim such that it overhangs the inner surface of lower rim 32 and covers the edge of the pedestal 28. The passageways 33 are 1.70 cm. high and 2.54 cm. wide such that the top of the passageway terminates at the juncture of the rim and the wall. These passageways 33 serve to allow free movement of the holddown clips 20 which must be opened to insert or remove or place wafers on the pedestal surface. It should be noted that if a different apparatus is used that does not employ such holddown clips these openings are not required. When used with 125 mm wafers this annulus 30 alters the electric fields so that, as shown in FIG. 7, all the field lines 36 over the entire wafer surface are substantially normal to the wafer surface.

Figure 7:
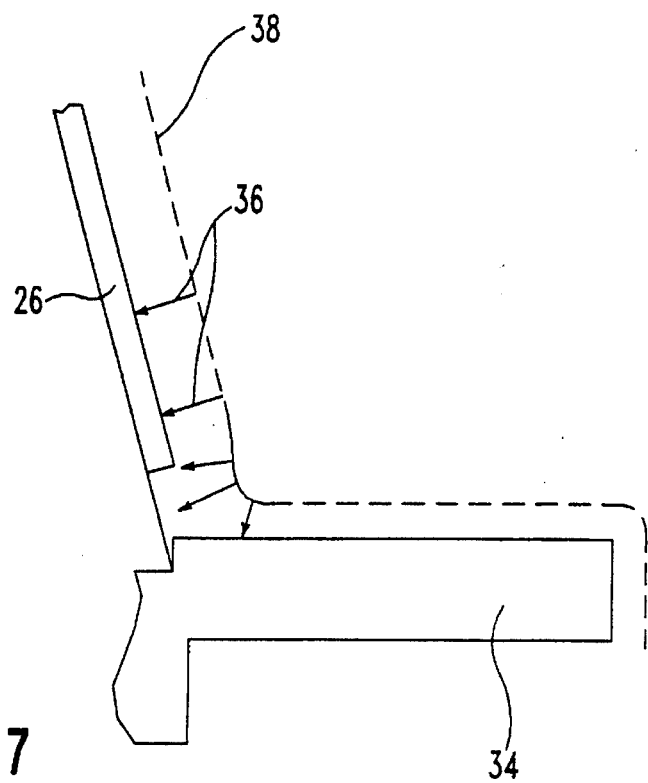
FIG. 7 is a greatly enlarged view of a section of FIG. 6 showing how the electric field lines and the plasma sheath is modified by the application of the annulus to the pedestal as shown in FIG. 6.

Returning now to FIG. 6 and viewing it in conjunction with FIG. 7, the plasma sheath 38 which has been modified by the presence of the annulus 30 will be further described. FIG. 7 shows in particular detail how the electric field lines 36, existing between the sheath 38 at the junction of the annulus 30 and pedestal 28 is modified in the region of the wafer edge by the presence of the annulus 30. In this FIG. 7 it can be seen that the annulus 30 and especially its upper wall 34 modifies the plasma sheath 38, i.e., causes the sheath 38 to substantially flatten out across the entire wafer surface, by preventing any downward bending of the sheath at the pedestal edges. Thus, the annulus 30 substantially eliminates the effects induced in the plasma sheath 38 and the field lines 36 by the pedestal edges. By so modifying the effects of the pedestal edge, the field lines 36 at the edges of the wafer become substantially normal in direction with respect to the wafer surface. This occurs because the annulus 30 effectively eradicates the effect of the pedestal edges and forces the plasma sheath to remain substantially flat across the entire wafer surface. The small difference in height that occurs between the sheath and the pedestal surface caused by the wafer being smaller in diameter than the pedestal induces a slight dipping in the plasma sheath before it begins to rise along the extended wall 34 of the annulus 30. The effects of this dipping however has no appreciable effect on the symmetry of any features formed in the wafer surface. Because, as noted above, the ions extracted from the plasma follow the field lines, any ions that do follow the few non-normal field lines 36 are so far removed from the wafer edge that they do not cause any asymmetries in features etched in the surface of the wafer.

Figure 10:
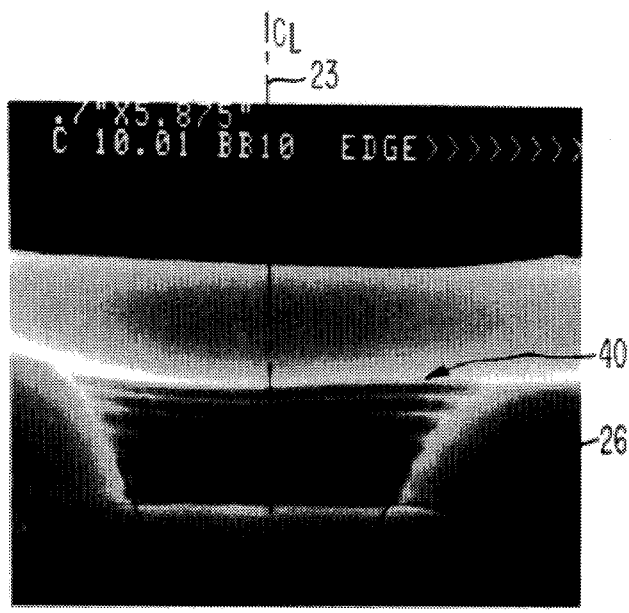
FIG. 10 is a cross sectional view of a feature, i.e. a hole, etched in the surface of a wafer when the annulus is positioned on the pedestal, used in the etching apparatus of FIG. 1, as shown in FIGS. 6 and 7.
Figure 11:
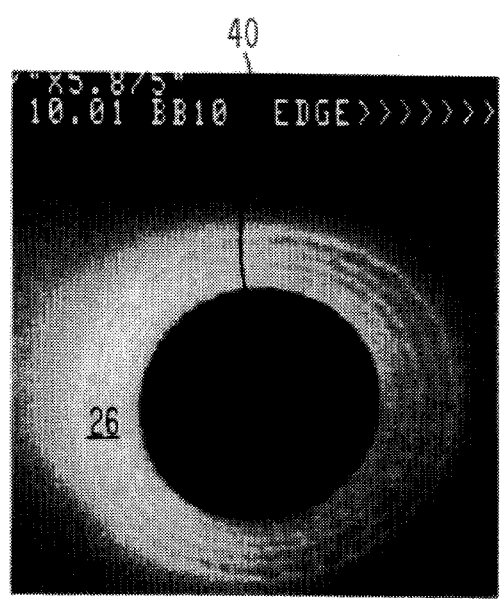
FIG. 11 is a top view of the etched hole of FIG. 10.

The symmetry of features, i.e., a hole formed in the surface of a semiconductor wafer using the annulus 30 is particularly apparent from a review of FIGS. 10 and 11 which are photographs of a hole 40 etched in the surface of a semiconductor wafer 26. FIG. 10 is a sectional view of the hole and FIG. 11 is a top view of the same hole. This hole was etched in the same region of a semiconductor wafer using the identical process and steps used to create the asymmetrical hole 21 shown in FIGS. 4 and 5. The effect of the annulus 30 in eliminating asymmetry is immediately apparent from these FIGS. 10 and 11 when compared to an axis 23 extending perpendicular to the surface of the wafer at the center of the opening. Thus, it is clear that all the walls are at the same angle with respect to a line drawn perpendicular to the surface of the wafer.

It should be noted that although the preferred embodiment has been described as etching a hole in the surface of a wafer that the surface of any suitable workpiece can be etched so as to leave other features both raised above or depressed into the workpiece's surface. Any feature so created will have walls that are at the same angle with respect to an axis drawn perpendicular to the surface of the workpiece.

Thus, it has been taught that by using an annulus 30 in a plasma or RIE etching apparatus, symmetrical etching of a feature can be obtained on or in the surface of a workpiece regardless of the position of the workpiece in the etcher or the position of the feature on the workpiece surface.

This symmetry occurs because the annulus 30 controls the uniformity of the plasma sheath with respect to the workpiece surface by eliminating the plasma sheath distortion within the annulus.

It should be understood that although the above description has been in conjunction with a batch etcher, the annulus can also be used in a single wafer etcher or in an etcher in which the pedestals have a different configuration. In such alternative contexts, it is preferred that the lower rim 32 of the annulus 30 conform to the configuration of the pedestal and the wall 34 overlap the pedestal edge.

Figure 12:
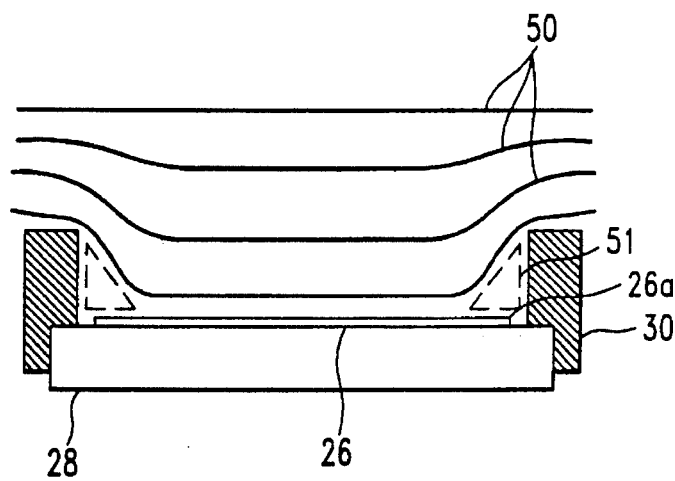
FIG. 12 is a cross sectional view of a wafer support pedestal used in the apparatus of FIG. 1 modified by the addition of an annulus and showing the alteration of the distribution of the process gases and creation of a gas depletion region induced by the annulus.

FIG. 12 shows, in detail, how the annulus can alter or modify the process gas at various points across the surface of the wafer 26. The presence of annulus 30 causes the process gas indicated by isobars 50 to move away from the inner surface of the annulus so that it appears to rise over the upper edge of the annulus and creates a ring region 51 over the periphery 26a of the wafer 26 in which the process gas is lessened, i.e., the gas depletion region referred to above. The process gases in the center of the wafer remain in close proximity with the wafer surface and in full strength. Thus the center surface of the wafer 26 etches at a rate different from the rate at which the periphery of the wafer under the gas depletion region etches. This difference in etching is particularly shown in FIG. 13. In this FIG. 13 the solid line 52 depicts the etching rate across the surface of the wafer when the annulus 30 surrounds the pedestal 28 and the wafer 26 and the present invention is not used. From this FIG. 13, it can be readily seen that the film at the center of the wafer is uniformly etched to a depth of 15,600 Angstroms but at the periphery of the wafer the amount of etching declines to 15,300 Angstroms. It is this decline in the amount of etching at the periphery of the wafer that causes the difference in the slope of the wall of the etched openings as can be seen by a comparison of FIGS. 14 and 15.

Figure 14:
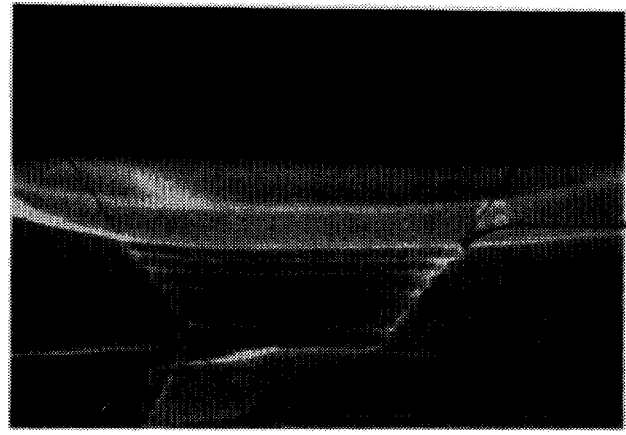
FIG. 14 is a cross sectional view of a feature, i.e. a hole, etched in the center of the surface of a wafer when the wafer was positioned on a pedestal surrounded with an annulus as shown in FIG. 12.
Figure 15:
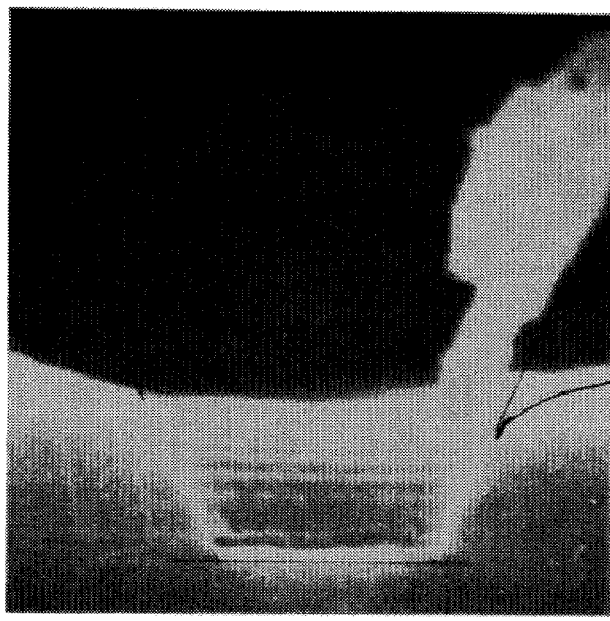
FIG. 15 is a cross sectional view of a feature, i.e. a hole, etched in the periphery of the surface of a wafer when the wafer was positioned on a pedestal surrounded with an annulus as shown in FIG. 12.

FIG. 14 is an actual photograph of a feature, e.g., a hole 61, etched in the center of the wafer and FIG. 15 is a photograph of the same type of feature e.g., a hole 62, etched in the periphery of the wafer in the gas depletion region 51 adjacent the annulus 30. Even a cursory review and comparison of these FIGS. 14 and 15 reveals the difference in the slope of the walls of the etched holes 61 and 62. Thus, the presence of the annulus 30, although it substantially eliminates the effects induced in the plasma sheath 38 and the field lines 36 by the pedestal edges and causes the holes to be symmetrical, as described above, simultaneously alters the amount of etching of the surface at the periphery of the wafer and thereby causes the slope of the walls of the holes 61 and 62 to be different.

Figure 13:
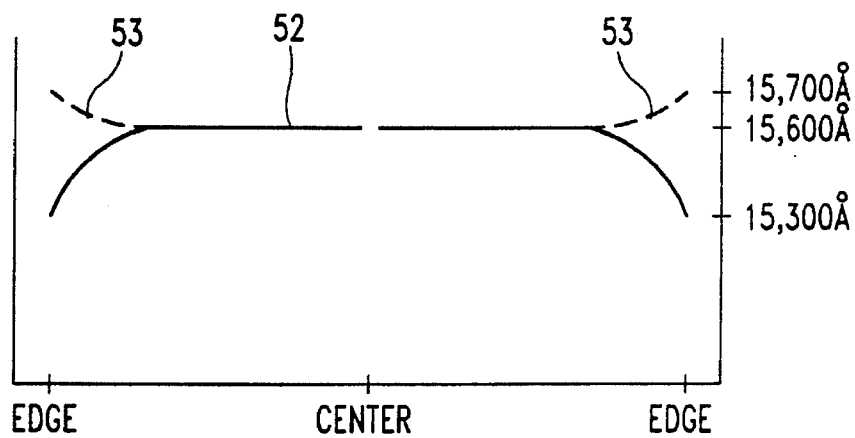
FIG. 13 is a graph showing how the etching of surface material is altered by the presence of the annulus and the resulting gas depletion region.

The present inventors have found that by introducing a controlled amount of a selected gas or gases into the depletion region 51 at a selected rate, the effect of the region 51 can be overcome and etching at the periphery of the wafer can be increased, even though the annulus 30 is present. This increase in the etching causes the ends of the line 52 to bend upwards as is depicted in FIG. 13 by the dotted lines 53.

Figure 16:
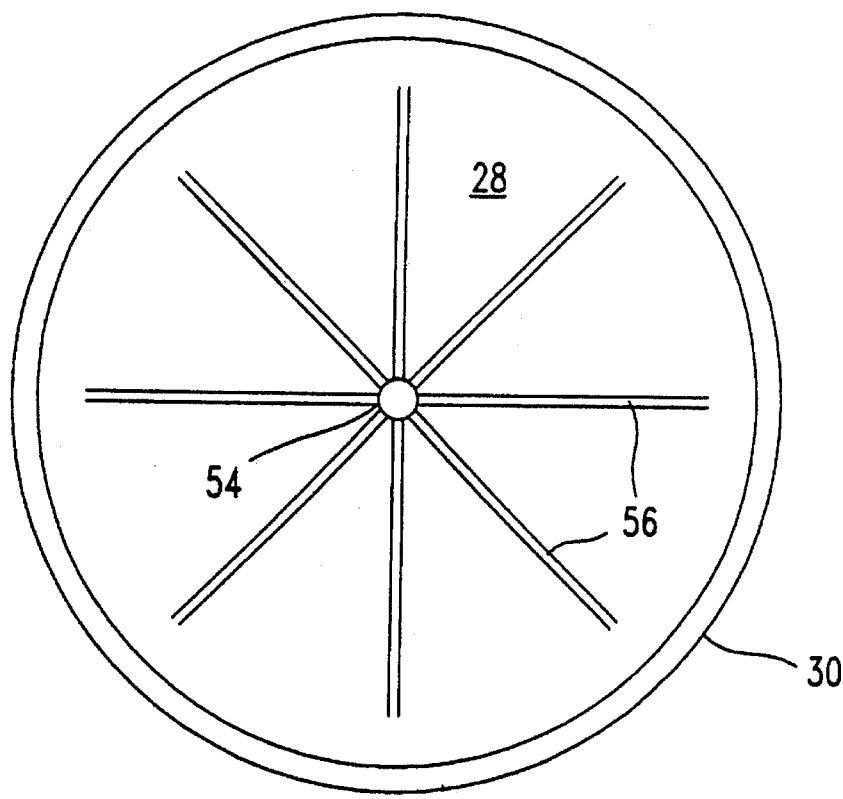
FIG. 16 is a top view of a pedestal modified to introduce gases into the gas depletion region at the edge of the wafer shown in FIG. 12.
Figure 17:
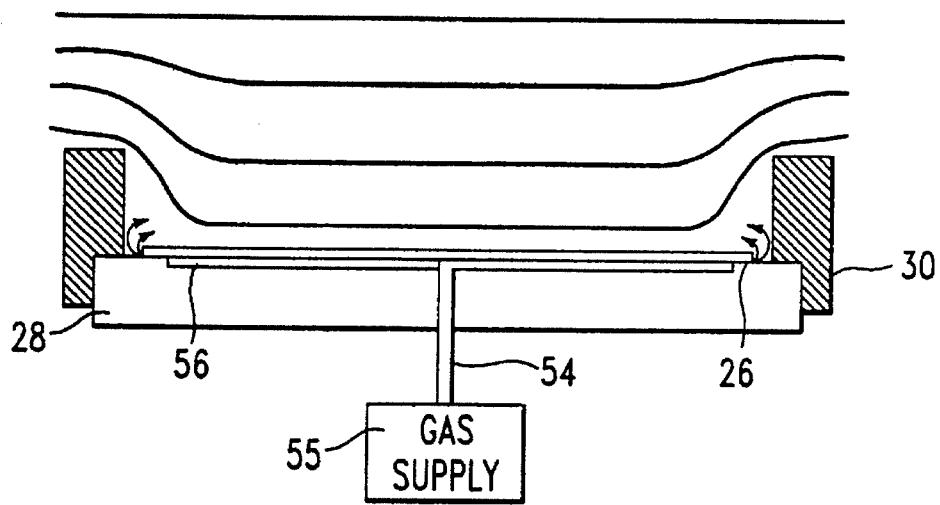
FIG. 17 is a cross sectional view of the pedestal of FIG. 16.

Specifically, the present inventors modified the pedestal 16 as shown in FIGS. 16 and 17 by passing a central orifice 54 up through the central axis of the pedestal 28 and coupling a pressurized gas source 55 to the orifice 54. This orifice 54, at the pedestal's upper surface 28a mates with a plurality of radial channels 56 which extend across the face of the pedestal almost to the periphery 26a of wafer 26.

The gas chosen should be a process gas, and ideally should have a small molecular size in order to maximize flow between the wafer and the pedestal. The flow rate is chosen by varying the flow so as to optimize structure of the etched features, which can be characterized by analyzing target film removal at the center and edge of the wafer.

Figure 18:
FIG. 18 is a cross sectional view of a feature, i.e. a hole, etched in the periphery of the surface of a wafer when the wafer was positioned on a pedestal surrounded with an annulus as shown in FIG. 12 and provided with additional gases as taught by the present invention.

When the etching procedure required a gas mixture of $CHF_3$ and $O_2$ to etch openings in the surface of the wafer the inventors found that if oxygen is forced into the orifice 54 and through the channels 55 at a rate that is between ten and seventy-five percent of the total flow of oxygen used in the chamber, then oxygen will be introduced into the gas depletion region 51 at a rate sufficient to overcome the depletion of the gases in the region 51. As a result, the removal at the edge of the wafer increases to the levels depicted by the dotted lines 53 shown in FIG. 13. In a specific example actually run, the amount of etching at the periphery of the wafer was increased from 15,300 to 15,700 Angstroms. This increase in the etching of the openings at the periphery of the wafer causes the slope of the walls of holes in the periphery to now match the slope of the walls of holes etched in the center of the wafer. This matching can be seen by a comparison of FIGS. 14, 15, and 18. FIG. 18 shows the same type of feature, e.g., a hole 63, etched in the periphery of the wafer formed when the additional gas was supplied in the depletion region as taught by the present invention. A comparison of FIGS. 14 and 18 shows that the slope of the walls of both holes 61 and 63 match.

Thus the present invention teaches that by controlling the amount of gas at the periphery of the wafer, openings with uniform wall slopes can be created over the entire surface of the wafer even though an annulus is being used to correct for the symmetry of the openings.

Figure 19:
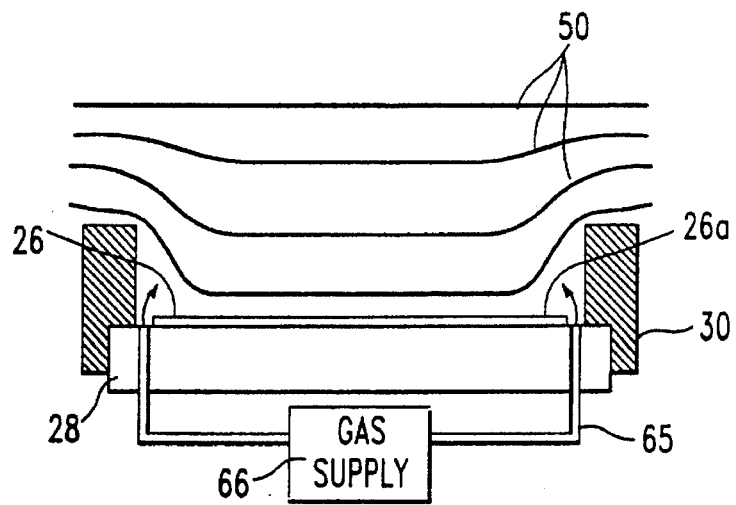
FIG. 19 shows another method of introducing gases into the gas depletion region shown in FIG. 13.

FIG. 19 shows a different technique for introducing the gas around the periphery of the wafer. In this Fig. the pedestal 28 is provided with a plurality of orifices 65 around the perimeter of the pedestal 28 inside the annulus 30 and outside the periphery of the wafer 26 and coupling these orifices 65 to a pressurized gas source 66.

It should be noted that although the preferred embodiment has been described as a process for etching a hole in the surface of a wafer, the invention can also be used to etch away the surface of any suitable workpiece so as to leave other features both raised above or depressed into the workpiece's surface. By using the present invention, any feature so created will have walls that are substantially at the same slope.

Thus, the invention teaches that by using an annulus 30 in a plasma or RIE etching apparatus, and supplying additional gas or gases at the periphery of the wafer and adjacent the annulus, symmetrical etching of a feature can be obtained and each feature will be etched the same amount regardless of the position of the workpiece in the etcher or the position of the feature on the workpiece surface.

It should be understood that although the invention has been described as using oxygen as the introduced gas that a gas mixture identical to the process gas or any of its constituents can also be used.

It should be further understood that means other than the central orifice and channels described above could be used to introduce a gas into the gas depletion region 51. For example the gas could be introduced through the annulus itself or could be showered down on the surface of the wafer from above. Both of these alternate solutions could, of course, require different gas pressures and or flows.

While the invention has been particularly described with respect to a preferred embodiment, it should be understood that one skilled in the art can, from the foregoing, readily make change in form and detail without departing from the spirit and scope of the invention.

What is claimed is:

1. A method of altering the electric field lines impinging on a workpiece in a plasma etch tool, comprising the steps of:

mounting a circular pedestal, of a selected diameter, on an electrode in said tool;

supporting a wafer with a periphery to be etched on said pedestal;

mounting an annulus made from an electrically insulative material on the pedestal and around the wafer to cause all the electric field lines between the plasma and the wafer to be substantially perpendicular to the wafer surface and to control the direction of the ions extracted from the plasma such that features formed in all regions of the wafer by the ions are substantially symmetrical around an axis extending perpendicular to the surface of the wafer at the center of the feature;

introducing a selection of gases into said tool and forming a plasma from said gases; and introducing a constituent gas of said selection of gases around the periphery of the wafer adjacent said annulus to compensate for any depletion of said constituent gas adjacent to and within said annulus.

2. The method of claim 1 wherein there is further provided the step of introducing said constituent gas around the periphery of the wafer by sending said gas through an orifice coupled to a plurality of channels in said pedestal under said wafer.

3. The method of claim 1 wherein there is further provided the step of introducing said constituent gas around the periphery of the wafer by sending said gas through an orifice coupled to a plurality of channels in said pedestal positioned around the periphery of said wafer.

* * * * *